United States Patent
Xu et al.

(10) Patent No.: US 9,306,066 B2
(45) Date of Patent: Apr. 5, 2016

(54) METHOD AND APPARATUS OF STRESSED FIN NMOS FINFET

(71) Applicant: QUALCOMM Incorporated, San Diego, CA (US)

(72) Inventors: Jeffrey Junhao Xu, San Diego, CA (US); Choh Fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/281,660

(22) Filed: May 19, 2014

(65) Prior Publication Data

US 2015/0249155 A1 Sep. 3, 2015

Related U.S. Application Data

(60) Provisional application No. 61/946,105, filed on Feb. 28, 2014.

(51) Int. Cl.
| | | |
|---|---|---|
| *H01L 27/01* | (2006.01) | |
| *H01L 29/78* | (2006.01) | |
| *H01L 21/02* | (2006.01) | |
| *H01L 29/66* | (2006.01) | |

(52) U.S. Cl.
CPC ...... *H01L 29/7849* (2013.01); *H01L 21/02164* (2013.01); *H01L 21/02238* (2013.01); *H01L 29/66795* (2013.01); *H01L 29/785* (2013.01)

(58) Field of Classification Search
CPC ... H01L 27/1203; H01L 21/84; H01L 21/775; H01L 27/12; H01L 29/66772
USPC .......................................................... 257/347
See application file for complete search history.

(56) References Cited

U.S. PATENT DOCUMENTS

| | | | |
|---|---|---|---|
| 7,462,916 B2 | 12/2008 | Williams et al. | |
| 8,278,175 B2 | 10/2012 | Cheng et al. | |
| 8,492,235 B2 * | 7/2013 | Toh | H01L 29/66795 257/E29.022 |
| 8,969,155 B2 * | 3/2015 | Cheng | H01L 29/66795 257/347 |
| 2003/0111699 A1 | 6/2003 | Wasshuber et al. | |
| 2005/0059201 A1 | 3/2005 | Chidambarrao et al. | |
| 2007/0257310 A1 | 11/2007 | Roper et al. | |
| 2008/0121948 A1 | 5/2008 | Kim et al. | |
| 2011/0024804 A1 | 2/2011 | Chang et al. | |

(Continued)

FOREIGN PATENT DOCUMENTS

WO 2005096372 A1 10/2005

OTHER PUBLICATIONS

International Search Report and Written Opinion—PCT/US2015/016081—ISA/EPO—Jun. 16, 2015.
Chan, M., et al., "SOI/bulk hybrid technology on SIMOX wafers for high performance circuits with good ESD immunity," IEEE Electron Device Letters, vol. 16, No. 1, 1995, pp. 11-13.
Ghani, T., et al., "A 90nm High vol. Manufacturing Logic Technology Featuring Novel 45nm Gate Length Strained Silicon CMOS Transistors," IEEE International Electron Devices Meeting, 2003. IEDM '03 Technical Digest. 2003, 3 pages.

(Continued)

*Primary Examiner* — Quoc Hoang
(74) *Attorney, Agent, or Firm* — Muncy, Geissler, Olds & Lowe, P.C.

(57) ABSTRACT

A semiconductor fin is on a substrate, and extends in a longitudinal direction parallel to the substrate. The fin projects, in a vertical direction, to a fin top at a fin height above the substrate. An embedded fin stressor element is embedded in the fin. The fin stressor element is configured to urge a vertical compression force within the fin, parallel to the vertical direction. Optionally, the semiconductor material includes silicon, and embedded fin stressor element includes silicon dioxide.

25 Claims, 6 Drawing Sheets

(56) References Cited

U.S. PATENT DOCUMENTS

| | | |
|---|---|---|
| 2011/0198695 A1 | 8/2011 | Anderson et al. |
| 2012/0153353 A1 | 6/2012 | Anderson et al. |
| 2013/0023092 A1 | 1/2013 | Oda et al. |
| 2014/0001569 A1 | 1/2014 | Hafez et al. |
| 2014/0231872 A1 | 8/2014 | Colinge et al. |

OTHER PUBLICATIONS

Serra, N., et al., "Experimental and physics-based modeling assessment of strain induced mobility enhancement in FinFETs," 2009 IEEE International Electron Devices Meeting (IEDM), 2009, pp. 1-4.

* cited by examiner

METHOD AND APPARATUS OF STRESSED FIN NMOS FINFET

CROSS-REFERENCE TO RELATED APPLICATIONS

The present Application for Patent claims the benefit of U.S. Provisional Application No. 61/946,105 entitled "METHOD AND APPARATUS OF STRESSED FIN NMOS FINFET," filed Feb. 28, 2014, assigned to the assignee hereof, and expressly incorporated herein by reference in its entirety.

FIELD OF DISCLOSURE

The present application is generally related to transistor structure and, more particularly, to FinFET devices.

BACKGROUND

Lower gate delay and faster switching speed have long been among the design goals of field effect transistor (FET) devices, which are a basic building block of integrated circuits (ICs). One known technique for reducing gate delay and increasing switching speed (collectively "improving FET speed") is a placement, in particular regions of certain FETs, of specifically structured stress-inducing elements. Such stress-inducing elements, also referred to in the semiconductor arts as "stressors," induce particular mechanical stress in the crystalline lattice of the semi-conductor channel, between the source and drain, in certain structures of FETs. As known to persons of ordinary skill in the semiconductor arts, the stresses may increase the electron mobility, hence, improve the FET speed.

FET structures currently used, for example, in consumer products and various other applications include "planar" FETs and three-dimensional "FinFETs." FinFETs can have certain advantages, for example, in overcoming the "short-channel" effects that can present when simply scaling down feature sizes of planar FETs. However, as has been known since FinFETs were introduced, a design objective they share with planar FETs is electron mobility. It has also been long known that certain of the stressor techniques that have proved useful in planar FETs may not be applicable to, or may incur particular costs when applied to FinFETs, particularly NMOS FinFETs.

SUMMARY

The following summary touches on certain examples in accordance with one or more exemplary embodiments. It is not a defining overview of all exemplary embodiments or contemplated aspects. It is not intended to prioritize or even identify key elements of all aspects, or to limit the scope of any embodiment or any aspect of any embodiment.

One example stressed fin FinFET device according to one or more exemplary embodiments can include a substrate, and a fin on the substrate. The fin can comprise a semiconductor material and can extend in a longitudinal direction parallel to the substrate, and can project or extend in a vertical direction to a fin top at a fin height above the substrate. In an aspect, an embedded fin stressor element can be embedded in the fin. The embedded fin stressor element can be configured to urge a vertical compression force within the fin, parallel to the vertical direction.

In an aspect, the semiconductor material can include silicon, and the fin stressor element can comprise silicon dioxide.

In an aspect, the fin can comprises a fin base and a fin active region, and the active region can include a source region, a drain region, and a channel region, the channel region being between the source region and the drain region. In a related aspect, the fin base can be proximal to the substrate, and the embedded fin stressor element is embedded in the fin base under the channel region.

In an aspect, the channel region can be doped with a p+ dopant, and the source region and the drain region are doped with an n+ dopant.

One example FinFET device according to one or more exemplary embodiments can comprise a substrate, and a fin, comprising a semiconductor material, having a fin width and extending in a vertical direction to a fin top at a fin height above the substrate. In an aspect, the fin can have a fin base extending on the substrate along a longitudinal axis, and a fin active portion on the fin base and extending in the vertical direction to the fin top. In related aspect, the fin base can have a height less than the fin height. The fin active portion can have a source region, a drain region, and a channel region between the source region and the drain region, and a gate can surround at least a portion of the channel region. In accordance with one or more exemplary embodiments, at least one embedded fin stressor element can be embedded under the fin active portion, and can be configured to urge a given compression force in the fin active portion, parallel to the vertical direction.

In an aspect, the semiconductor material can include silicon, and the at least one embedded fin stressor element can comprise silicon dioxide.

In an aspect, the at least one stressor element can be embedded in the fin base under the channel region.

Example methods according to various exemplary embodiments can provide, among other features, vertical compression in a fin of a FinFET. In an aspect, example methods can include forming a semiconductor fin, of a silicon semiconductor material, and having a given channel region, on a substrate, forming an oxygenation mask on the semiconductor fin, providing at least an exposed region under the given channel region. Example methods according to various exemplary embodiments can include performing oxidation on at least the exposed region under the given channel region, penetrating to form an oxidation region under the given channel region. Example methods can include, in an aspect, forming a silicon dioxide layer, wherein the silicon dioxide layer can be embedded under the given channel region of the semiconductor fin. In a related aspect, the silicon dioxide layer can be formed by performing a Separation by Implantation of Oxygen (SIMOX) operation on at least the oxidation region under the given channel region.

In an aspect, in example methods according to various exemplary embodiments, the SIMOX operation can include a re-crystallization of the given channel region and at least the oxidation region under the given channel region. In a related aspect, the silicon dioxide layer can form during the re-crystallization, and the forming of the silicon dioxide layer can include a volume expansion that establishes a vertical compressive stress in the channel region.

In accordance with one or more exemplary embodiments, a computer-readable medium can comprise computer-executable instructions that when executed by a computer connected to a semiconductor fabrication system cause computer to control the semiconductor fabrication system to form a semiconductor fin, of a silicon semiconductor material, having a given channel region, on a substrate. The computer-executable instructions can, when executed by a computer connected to a semiconductor fabrication system, cause computer to form an oxygenation mask on the semiconductor fin, the oxygenation mask provides at least an exposed region under the given channel region. In an aspect, the computer-executable instructions can, when executed by a computer connected to a semiconductor fabrication system, cause computer to perform oxidation on at least the exposed region under the given channel region, penetrating to form an oxidation region under the given channel region. In an aspect, the computer-executable instructions can, when executed by a computer connected to a semiconductor fabrication system, cause computer form a silicon dioxide layer that can be embedded under the given channel region of the semiconductor fin, by performing a Separation by Implantation of Oxygen (SIMOX) operation on at least the oxidation region under the given channel region. In an aspect the SIMOX operation can include a re-crystallization of the given channel region and at least the oxidation region under the given channel region, wherein the silicon dioxide layer can form during the re-crystallization, and the forming of the silicon dioxide layer can include a volume expansion that can establish a vertical compressive stress in the channel region.

BRIEF DESCRIPTION OF THE DRAWINGS

The accompanying drawings are presented to aid in the description of embodiments of the invention and are provided solely for illustration of the embodiments and not limitation thereof.

FIG. 1B 100 is a perspective view of an outer surface of the FIG. 1A stressed fin NMOS FinFET with certain out portions of the gate drawn transparent.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for describing particular examples illustrating various embodiments, and is not intended to be limiting of embodiments of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

According to one or more exemplary embodiments, a stressed fin NMOS FinFET provides increased electron mobility by novel techniques of compression stressing the fin, by novel embedding of particularly configured stressor elements. In an aspect, at least one stressor element may be embedded in the semiconductor fin, configurable in accordance with one or more exemplary embodiments to exert a particular, selectable magnitude and distribution of vertical compression force on the semiconductor material of the semiconductor fin. Configuration parameters include, for example, selectable quantity, position, shape, dimension, and orientation within the semiconductor fin. In an aspect, setting of the configuration parameters can be provided by straightforward setting of oxidation masks, as described in greater detail later in this disclosure.

In an aspect, desired or target magnitude and distribution of vertical compression force within the semiconductor fin may be given. In another aspect, a target electron mobility of regions within the semiconductor fin may be given and, based on the given target electron mobility and a given, or readily identifiable mapping of vertical compression stress versus electron mobility characteristics of the fin, the target magnitude and distribution (and tolerance) of vertical compression force within the semiconductor fin can be determined. It will be appreciated by persons of ordinary skill in the relevant art, upon reading this disclosure, that determining target magnitude and distribution of vertical compression force within the semiconductor fin to meet a given, or earlier determined electron mobility requirement can be performed by adapting and applying conventional, commercially available, semiconductor simulation and design tools, without undue experimentation.

In an aspect, upon determining, or being given, or using a previously determined target magnitude and distribution of vertical compression force within the semiconductor fin, parameters of embedded stressor elements according to various exemplary embodiments that will provide such magnitude and distribution can be determined Example parameters may include, but are not necessarily limited to quantity (e.g., two, three, or four), material, shape(s), dimension(s), orientation(s), and position(s) of the embedded stressor elements. It will be appreciated by persons of ordinary skill in the semiconductor art, upon reading the present disclosure, that such persons can determine acceptable values of such parameters of the embedded stressor elements by adapting and applying conventional, commercially available, semiconductor simulation and design tools, without undue experimentation.

According to an aspect, methods for forming one or more stressor elements may include forming oxygen implantation masks on the semiconductor fin, implanting oxygen and/or performing other oxidation operations utilizing the oxygen implantation mask, combined with high temperature annealing and re-crystallization to form embedded stressor elements. In an example, the embedded stressor elements may be silicon dioxide layer. In an aspect, such forming of embedded stressor elements in accordance with various exemplary embodiments exploits, in novel manners, volume expansion effects obtainable through high temperature annealing and re-crystallization.

In an aspect, the forming of oxygen implantation masks, implanting oxygen and/or oxidation operations, high temperature annealing and re-crystallization may be adapted to, and incorporated in, conventional FinFET fabrication with little, if any, substantive compromise of other design and fabrication goals, and little, if any, added overhead.

In a further aspect, tuning, tweaking and other varying of certain parameters of the embedded stressor elements may be obtained by simply varying the oxidation masks used in the oxygen implantation.

As will be described in further detail, with reference to various examples in the figures stressed fin FinFET device in accordance with one or more exemplary embodiments can include a substrate, and a fin on the substrate. The fin can be a semiconductor material and can extend in a longitudinal direction parallel to the substrate. The semiconductor material can include silicon. The fin can project or extend in a vertical direction to a fin top at a fin height above the substrate. The fin can have a first vertical wall and a second vertical wall, and the second vertical wall can be parallel to the first vertical wall and spaced from the first vertical wall by a fin thickness.

In accordance with various exemplary embodiments, the stressed fin FinFET device can include an embedded fin stressor element that can be embedded in the fin and configured to urge a vertical compression force within the fin, parallel to the vertical direction. In as aspect, the fin stressor element can comprise silicon dioxide. wherein the SIMOX operation includes a re-crystallization of the given channel region and at least the oxidation region under the given channel region, wherein the silicon dioxide layer forms during the re-crystallization, and wherein the forming of the silicon dioxide layer includes a volume expansion that establishes a vertical compressive stress in the channel region.

In an aspect, the embedded fin stressor element can have a stressor element thickness in the vertical direction, a stressor element width in a direction of the fin thickness, and a stressor element length in the longitudinal direction. In a further aspect, the stressor element width can be equal to the fin thickness.

Figure 1A:
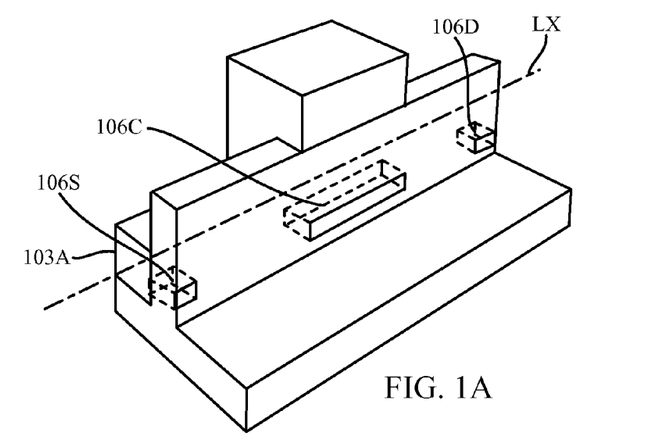
FIG. 1A is a partial cut-away perspective view of one example stressed fin NMOS FinFET device according to one or more exemplary embodiments.
Figure 1B:
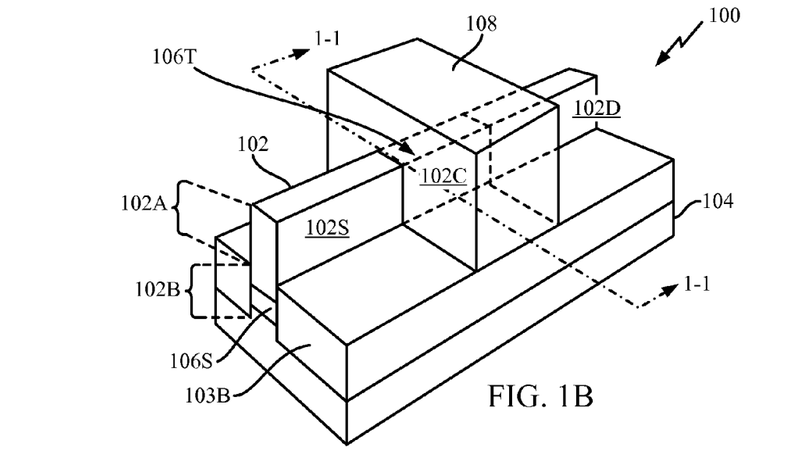
Figure 1C:
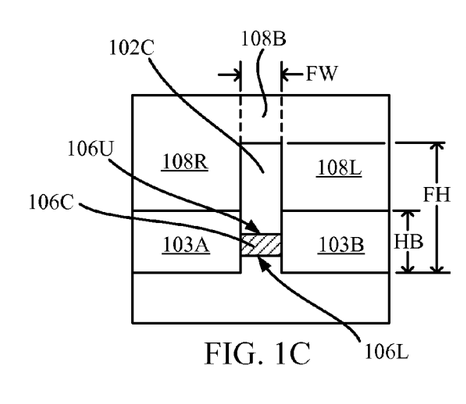
FIG. 1C is a sectional view of the FIG. 1A stressed fin NMOS FinFET device, from the FIG. 1A cutting plane 1-1.

FIG. 1A is a partial cut-away perspective view of one example stressed fin NMOS FinFET device 100 (hereinafter referred to, for brevity as "SFN FinFET 100.") FIG. 1B is a perspective view of an outer surface of the SFN FinFET 100 with certain out portions of the gate 108 drawn transparent. FIG. 1C is a sectional view from the FIG. 1A cut plane 1-1.

Referring to FIGS. 1A and 1B, the SFN FinFET 100 can include semiconductor fin 102 formed, for example, of silicon (Si) and supported, for example, by a substrate 104. The semiconductor fin 102 (hereinafter referred to as "fin 102") can extend along a longitudinal axis LX on, or parallel a surface (shown but not separately labeled) of the substrate 104. The fin 102 may extend up from the substrate 104 in a generally vertical direction (i.e., normal to the substrate) to a fin top surface 102T at a fin height FH above the substrate 104. The fin 102 may have opposing parallel outer walls spaced apart by a fin thickness or fin width, such as the fin first vertical wall 102R and the fin second vertical wall 102L, which are spaced apart by the fin thickness or width FW. The fin 102 may be formed, for example by shallow-trench isolation (STI) regions, as shown by STI regions 103A and 103B (collectively "STI regions" 103).

In an aspect, a fin in a stressed fin FinFET device in accordance with one or more example embodiments can have regions or portions designated as a fin base proximal to the substrate and a fin active region that may be above the fin base. The active region may include a source region, a drain region, and a channel region, with the channel region being between the source region and the drain region. In accordance with one or more exemplary embodiments a fin stressor element, or a plurality of fin stressor elements, can be embedded in the fin base. In an aspect, one example fin stressor element can be embedded under the channel region.

Referring to FIG. 1, in an aspect, the fin 102 may comprise, listed in a vertically ascending order starting with the portion most proximal to, i.e., closest to the substrate, a fin base 102B and a fin active region 102A. It will be understood that the fin base 102B and fin active region 102A are designations of region in accordance with function, and do not necessarily define separable or distinct structures. In an example, the fin base 102B may have a height HB. It will be understood that the height HB is not necessarily uniform along the LX axis.

Referring to FIG. 102A, in accordance with various exemplary embodiments, embedded in the fin 102, for example in the fin base 102B, is at least one embedded stressor element, such as the example embedded stressor elements 106C, 106S and 106D (collectively referenced as "embedded fin stressor elements" 106). The embedded stressor element 106C may be referred to as the embedded fin channel stressor 106C. The embedded stressor element 106S may be referred to as the embedded fin source stressor 106S, and the embedded drain stressor element 106D may be referred to as the embedded fin drain stressor 106D.

It will also be understood that the example arrangement, quantity, and respective shapes and dimensions of the example embedded fin stressor elements 106 that is visible in FIGS. 1A-1C is not intended as any limitation on the arrangement(s), quantity, and respective shapes and dimensions of embedded fin stressor elements 106 in accordance with the exemplary embodiments.

Example formation and other aspects of embedded fin stressor elements, such as the example embedded fin stressor elements 106, are described in greater at later sections.

Referring to FIG. 1B, the fin 102 may have a source region 102S located, for example at or proximal to one of the fin 102 end as shown, and a drain region 102D separated from the source region 102S by a channel region 102C. The source region 102S and the drain region 102D may each be doped with an n+ dopant (not explicitly visible in FIGS. 1A-1C). The n+ doping of the source region 102S and drain region 102D may have a conventional concentration profile, using conventional NMOS FinFET doping techniques. The channel region 102C may be doped with a p+ dopant (not explicitly visible in FIGS. 1A-1C), also according to a conventional NMOS NMOC FinFET fin p+ channel dopant profile, using conventional NMOS FinFET doping techniques.

Referring to FIGS. 1A and 1B, a gate 108 may essentially straddle the channel region 102C. The gate 108 may be formed, for example, of a reasonably good conducting material, such as a poly-silicon. The gate 108 is electrically insulated from the fin 102 by an insulating layer (not explicitly visible in FIGS. 1A-1C), e.g., silicon dioxide. The gate 108 may have an inverted U-shape, including a bridge or connecting portion 108B that passes over the fin top 106T, and from which spaced gate arms 108R and 108L extend toward the substrate 104, having opposing inward facing surfaces (shown but not separately labeled). The opposing inward facing surfaces may be spaced apart by a distance (shown but not separately labeled) that is equal, or approximately equal, the fin thickness FW added to twice the thickness (not visible in FIGS. 1A-1C) of the insulating layer.

Figure 1D:
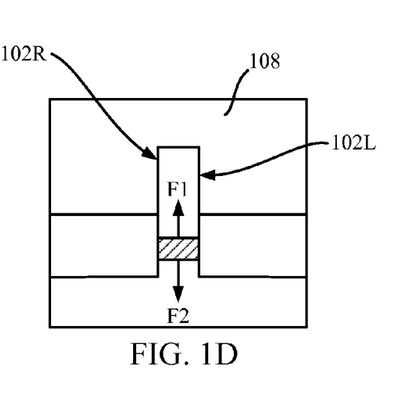
FIG. 1D is the FIG. 1C sectional view, annotated to show example force vectors associated with one example embedded fin stressor in accordance with one or more exemplary embodiments.

FIG. 1D is the FIG. 1C sectional view, annotated to show example stress force vectors associated with the embedded fin channel stressor 106C in accordance with one or more exemplary embodiments. As described in greater detail later in this disclosure, elements, in accordance with various exemplary embodiments, the embedded fin channel stressor 106C (and other of the embedded stressor elements 106) may be formed by selective oxidation, high temperature annealing and re-crystallization. Formation of the embedded stressor elements 106 according to these aspects can obtain volume expansion effects that exert considerable, selectable and usable compressive force. In an aspect, by the exemplary embodiments' novel forming of the embedded stressor elements 106, the embedded stressor elements 106 may have a width (in the FW (fin thickness) direction) approximately the same as FW. Accordingly, forces obtained by the volume expansion effect may be primarily directed upward or vertically. Referring to FIG. 1D, force vectors F1 and F2 (which are equal and opposite) illustrate this aspect.

It will be understood that the example stress forces described in reference to the embedded fin channel stressor 106C can be obtained, and provided in like manner by the embedded fin source stressor 106S and embedded fin drain stressor 106D.

FIGS. 2A-2H shows by, snapshot sequence, example operations in parts of process of fabricating a stressed fin NMOS FinFET device, such as the FIG. 1A-1D SFN FinFET 100, in accordance with various exemplary embodiments. To avoid obfuscation by description of details not particular to the embodiments, FIGS. 2A to 2H focus on operations and structures demonstrating novel concepts. It will therefore be understood that the snapshots shown by FIGS. 2A to 2G omit description of details not particular to the embodiments, except where such details may be incidental to described operations or structures demonstrating concepts.

Figure 2A:
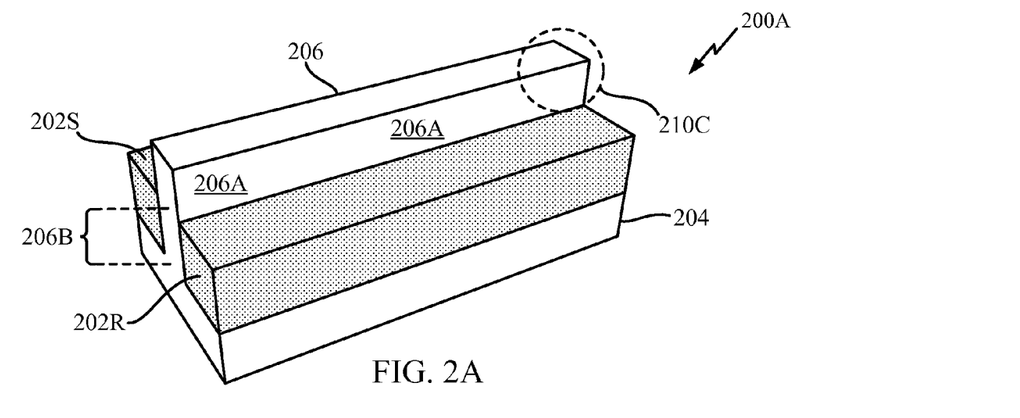
FIGS. 2A-2H shows, by snapshot sequence, example operations in part of a process of fabricating a stressed fin NMOS FinFET device in accordance with various exemplary embodiments.

Referring to FIG. 2A, operations in one process can include a starting structure 200, comprising shallow-trench isolation (STI) regions 202S and 202R (collectively "STI regions" 202) on substrate 204, spaced by a trench (shown but not separately labeled) in which a fin 206, for example of silicon, is formed. The fin 206 may be labeled with fin base region 206B and fin active region 206A that correspond to the fin base 102B and fin active region 102A, respectively, described in reference to FIGS. 1A-1D.

Figure 2B:
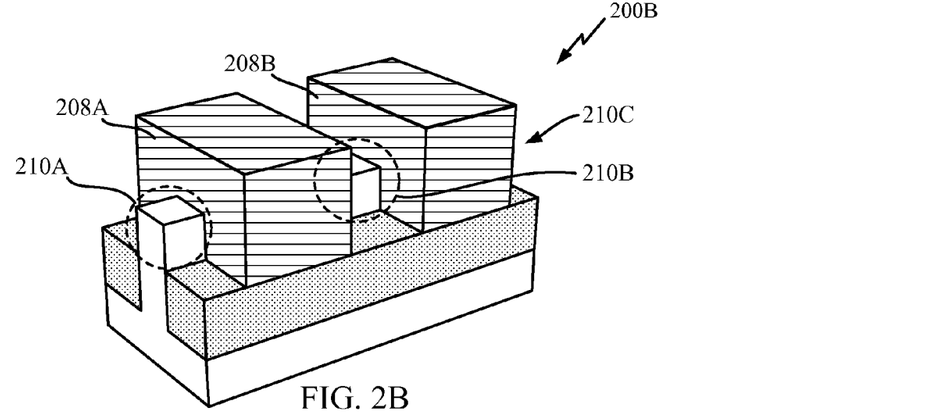

Next, referring to FIG. 2B, oxygen implant masks such as the oxygen implant masks 208A and 208B (collectively oxygen implant masks 208) may be formed, to obtain in-process structure 200B. In an aspect, the oxygen implant masks 208 may be formed to leave exposed surface regions of the fin active region 206A, such as the first exposed region 210A and second exposed region 210B. It will be understood that the FIG. 2B example oxygen implant masks 208 also leave exposed a third surface region shown on FIG. 2A as 210C, of which view is obstructed by the oxygen implant mask 208B. As described in greater detail in reference to later figures of the FIG. 2A-2H snapshot sequence, first exposed region 210A, second exposed region 210B and third exposed region 210C (collectively, "exposed regions 210") may establish respective positions and dimensions (i.e., lengths) along the LX axis, of embedded fin stressor elements 106. Referring to FIGS. 1A and 2B together, it will be apparent that forming the embedded fin stressor elements 106 may employ corresponding configuration of the oxygen implant masks 208.

Figure 2C:
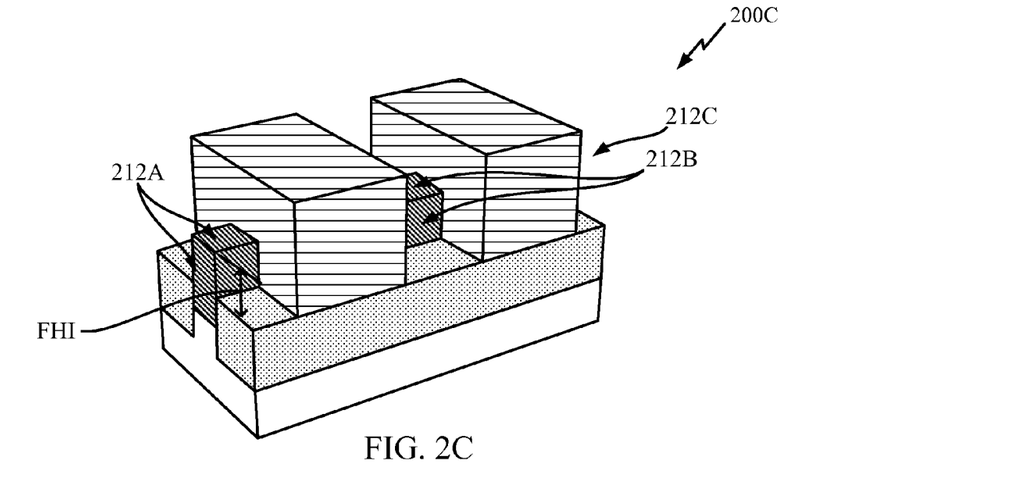

Referring next to FIG. 2C, in an aspect an oxygen implanting may be performed on the in-process structure 200B to implant oxygen into the exposed regions 210 to obtain corresponding in-process structure 200C. The in-process structure 200C forms, on exposed surfaces of the fin 206, a first oxygen implanted region 212A, a second oxygen implanted region 212B and a third oxygen implanted region 212C (collectively "oxygen implanted regions 212"). Visibility of the third oxygen implanted region 212C is obstructed in FIG. 2C by the oxygen implant mask 208B. In an aspect, the oxygen implanted regions 212 may cover areas of the exposed regions, including the entire height (e.g., height labeled "FHI" on FIG. 2C) from the top surface of the STI regions 202 to the fin top (shown, but not separately labeled).

As will be appreciated by persons of ordinary skill in the art, upon reading the present disclosure, specific values or process parameters, such as temperature and implant dose, applied in the oxygen implanting related to FIG. 2C may be application specific. One illustrative, non-limiting example range of oxygen implant dose range may be approximately $10^{17}$ to $10^{18}/cm^2$, at an example temperature of approximately 600 degrees Celsius. Persons of ordinary skill in the art, upon reading the present disclosure, may identify other ranges of the oxygen implant dose and temperature.

Figure 2D:
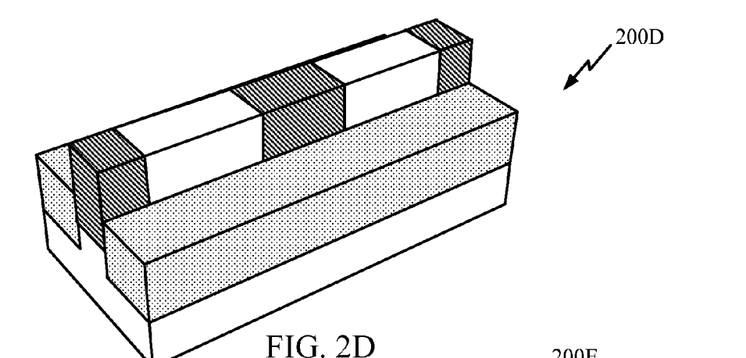

Referring to FIG. 2D, after the oxygen implantation, the oxygen implantation masks 208A and 208B may be removed to provide the in-process structure 202D.

Figure 2E:
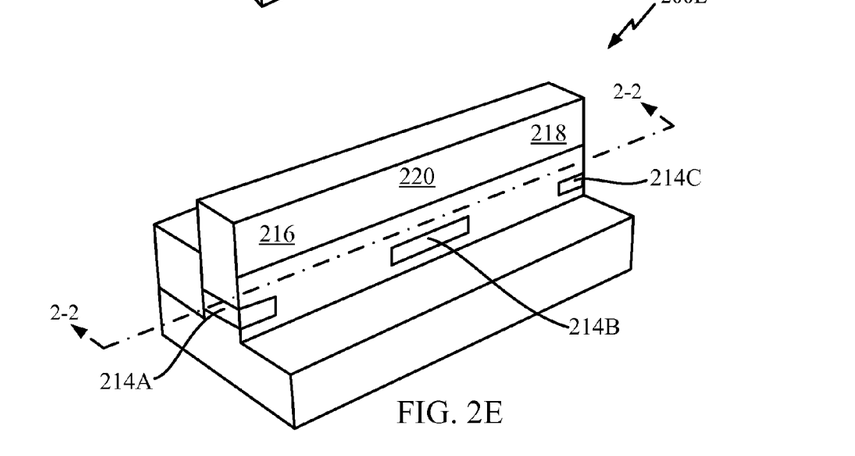

Next, referring to FIG. 2E, in an aspect, a Separation by IMplantation of OXygen (SIMOX) operation, which is a high temp anneal followed by re-crystallization from implant damage, may be performed on the in-process structure 200D to form in-process structure 200E. The SIMOX operation can, in a further aspect, form a first embedded $SiO_2$ layer or element 214A, a second embedded $SiO_2$ layer or element 214B and a third embedded $SiO_2$ layer or element 214C (collectively "embedded $SiO_2$ elements" 214) in the fin base, under what will be the fin active region. It will be understood that during the re-crystallization the volume expansion of $SiO_2$ can be significantly higher than the volume expansion of Si. In an aspect, the combination of the oxygen implantation described in reference to FIG. 2C, and the high temperature anneal followed by re-crystallization described in reference to FIG. 2E can form the embedded $SiO_2$ elements 214 with a width substantially the same as the thickness TW of the fin 102. Accordingly, the higher volume expansion of the embedded $SiO_2$ elements 214 can produce considerable upward (and equal downward) force, such as the examples FCM shown. The embedded $SiO_2$ elements 214 thereby perform as the fin stressor elements 106 described in reference to FIGS. 1A-1D.

In an aspect, a source region 216, and a drain region 218 may each be doped with an n+ dopant (not explicitly visible in FIG. 2E). The n+ doping of the source region 216 and drain region 218 may have a conventional concentration profile, using conventional NMOS FinFET doping techniques. The channel region 220 may be doped with a p+ dopant (not explicitly visible in FIG. 2E), also according to a conventional NMOS FinFET fin p+ channel dopant profile, using conventional NMOS FinFET doping techniques.

Figure 2F:
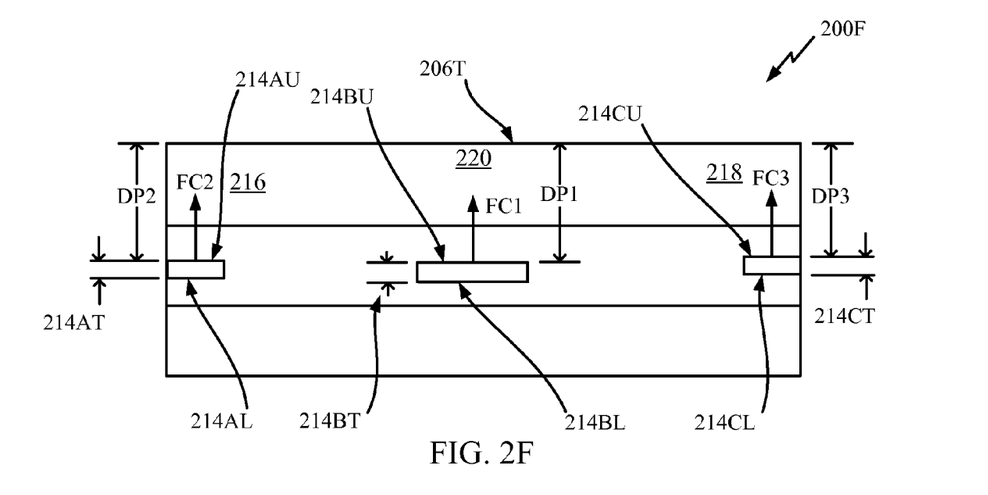

FIG. 2F shows the in-process structure 200E from the FIG. 2E projection plane 2-2. For convenience, in description referencing FIG. 2F, the embedded $SiO_2$ element 214B will be referred to as a "first embedded fin stressor element" 214B, the embedded $SiO_2$ element 214A will be referred to as a "second embedded fin stressor element 214A, and the embedded $SiO_2$ element 214C will be referred to as a "third embedded fin stressor element 214C." Referring to FIG. 2F, the first embedded fin stressor element 214B and the fin 206 meet at an upper major interface 214BU that is interior to the fin 206 and is spaced a depth DP1 under the fin top 206T. The depth DP1 is in a depth direction (not separately labeled) that is opposite the vertical direction VR. The first fin stressor element 214B and the fin 206 have a lower major interface 214BL that is spaced by a first stressor element thickness 214BT under the upper major interface 214BU in the depth direction. Due to the higher volume expansion of the embedded $SiO_2$, the first fin stressor element 214 exerts, at the upper major interface 214BU, an upward compression force FC1 against the channel region 220 of the fin 206. As shown, the upward compression force FC1 is in the vertical direction VR.

Continuing to refer to FIG. 2F, for convenience in describing operations and contributions of the second embedded fin stressor element 214A and the third embedded fin stressor element 214C, the depth DP1 will be referred to as a "first depth DP1," and the upward compression force FC1 will be referred to as a "first upward compression force FC1." For similar purposes of convenience, the upper major interface 214BU will be referred to as a first upper major interface 214BU and the lower major interface 214BL as a first lower major interface 214B. The second embedded fin stressor element 214A and the fin 206 have a second upper mutual interface 214AU and a second lower mutual interface 214AL. The second upper major interface 214AU is interior to the fin 206 and is spaced a second depth DP2 under the fin top 206T in the depth direction. The second lower major interface 214Al is spaced by a second stressor element thickness, 214AT under the second upper major interface 214AU in the depth direction.

With continuing reference to FIG. 2F, due to the higher volume expansion of the $SiO_2$ of which it is formed, the second embedded fin stressor element 214A exerts, at the second upper major interface 214AU, a second upward compression force FC1 against the source region 216 of the fin 206. In a similar manner, the third embedded fin stressor element 214C and the fin 206 have a third upper major interface 214CU and a third lower mutual interface 214CL. The third upper major interface 214CU is interior to the fin 206 and is spaced a third depth DP3 under the fin top 206T in the depth direction. The third lower major interface 214CL is spaced by a third stressor element thickness, 214CT under the third upper major interface 214CU in the depth direction. Due to the higher volume expansion of the $SiO_2$ of which it is formed, the third embedded fin stressor element 214C exerts, at the third upper major interface 214CU, a third upward compression force FC3 against the drain region 218 of the fin 206.

Figure 3:
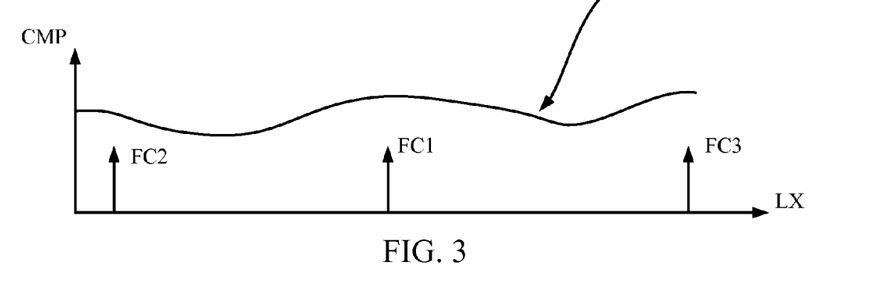
FIG. 3 shows one example form of one hypothetical vertical compression force distribution along a longitudinal axis of a stressed fin NMOS FinFET device in accordance with various exemplary embodiments.

Referring to FIG. 3, the first upward compression force FC1, the second upward compression force FC2 and the third upward compression force FC3 sum to a total resultant upward compression force having a force distribution, such as the hypothetical force distribution labeled "CMP Profile," with respect to positions along the longitudinal axis LX, or along an axis parallel to LX.

Referring to FIG. 2F, in an aspect, one of the first depth DP1 and the second depth DP2 can be greater than the other. Likewise, one of the first stressor element thickness 214BT and the second stressor element thickness 214AT can be greater than the other.

Figure 2G:
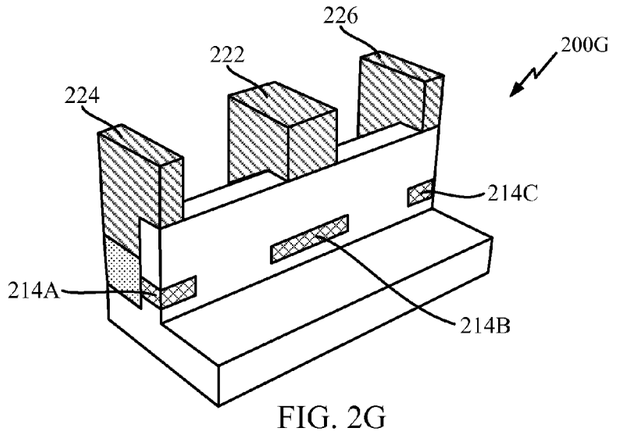

Next, referring to the FIG. 2G partial cut-away view, in an aspect, a gate 222, a source electrode or contact 224 and a drain electrode or contact 226 may be formed to obtain the stressed fin NMOS FinFET device 200F. The gate 222, source electrode or contact 224 and drain electrode or contact 226 may be formed using conventional NMOS FinFET techniques.

Figure 2H:
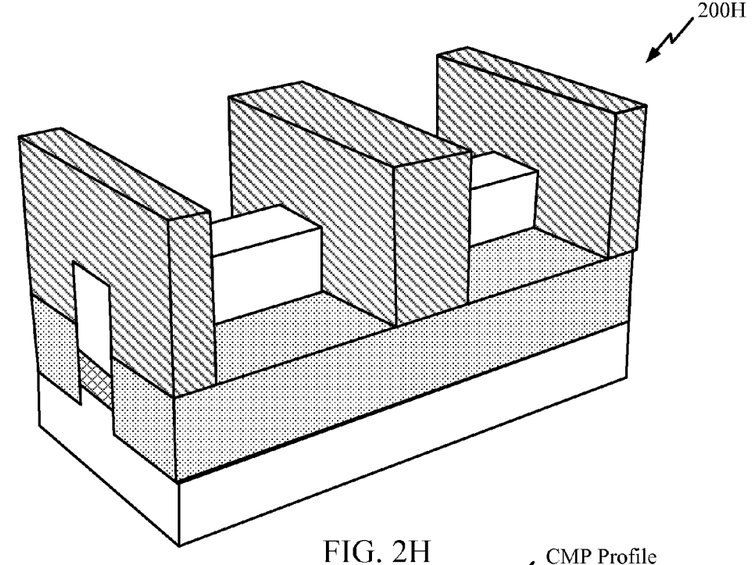

FIG. 2H shows an outer perspective view 200G of the FIG. 2F stressed fin NMOS FinFET device 200F.

It will be understood that the gate 222 of the stressed fin NMOS FinFET device 200F is only one example. Various exemplary embodiments include alternative gates, such as a two-input gate (not shown in the figures) omitting the region 222B.

Figure 4:
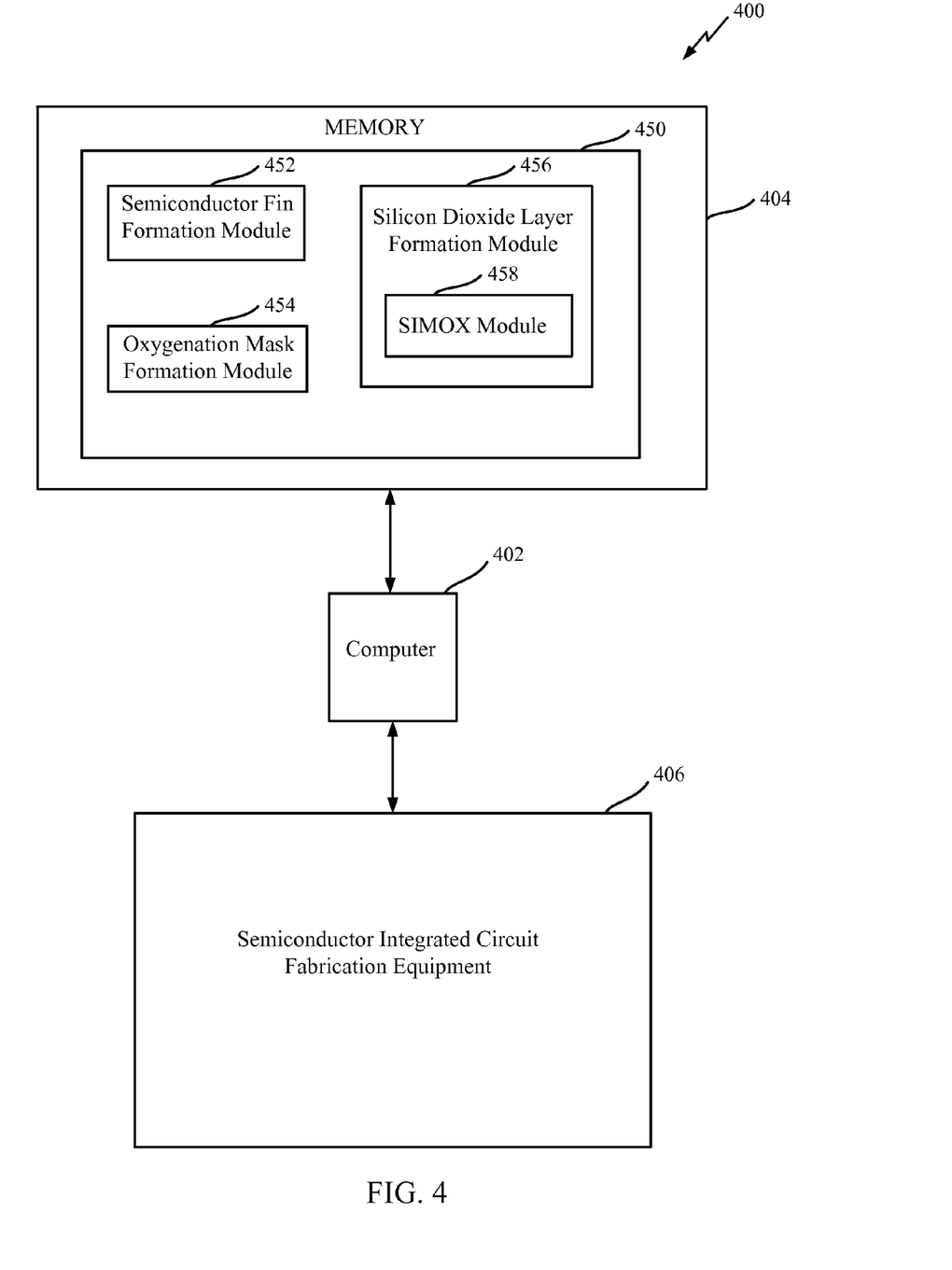
FIG. 4 shows a high-level functional block diagram of a semiconductor fabrication system for forming stressed fin FinFET devices in accordance with various exemplary embodiments.

Referring to FIG. 4, a semiconductor fabrication system 400 may include a computer 402 coupled to a memory 404 that stores computer executable instructions 450 that, when executed by the computer 402, cause the computer 402 to control semiconductor fabrication equipment 406 to perform operations in a fabrication process according to one or more exemplary embodiments. In an aspect, example operations can include operations in the snapshot sequence shown in FIGS. 2A-2G.

Continuing to refer to FIG. 4, in an aspect, the computer executable instructions 450 can include a semiconductor fin formation module 452, configured to cause the computer 402 to form a semiconductor fin, of a silicon semiconductor material, having a given channel region, on a substrate. In an aspect, the computer executable instructions 450 can include an oxygenation mask formation module 454, configured to cause the computer 402 to control the semiconductor fabrication equipment 406 to form an oxygenation mask on the semiconductor fin. In an aspect, the oxygenation mask formation module 454 may be configured such that the oxygenation mask provides at least an exposed region under the given channel region. In an aspect, the computer executable instructions 450 can include a silicon dioxide layer formation module 456, configured to control the semiconductor fabrication equipment 406 to form a silicon dioxide layer that is embedded under the given channel region of the semiconductor fin. In a further aspect, the silicon dioxide layer formation module 456 can be configured to include a Separation by Implantation of Oxygen (SIMOX) module 458 to cause the computer 402 to control the semiconductor fabrication equipment 406 to form the semiconductor layer by performing a SIMOX operation on at least the oxidation region under the given channel region. Further to this aspect, the SIMOX module 458 can be configured to cause the computer 402 to control the semiconductor fabrication equipment 306 to perform the SIMOX operation to include a re-crystallization of the given channel region and at least the oxidation region under the given channel region. In an aspect, the SIMOX module 458 can be configured such that the silicon dioxide layer forms during the re-crystallization. In a further aspect, the SIMOX module 458 can be configured such that the forming of the silicon dioxide layer includes a volume expansion that establishes a vertical compressive stress in the channel region.

Figure 5:
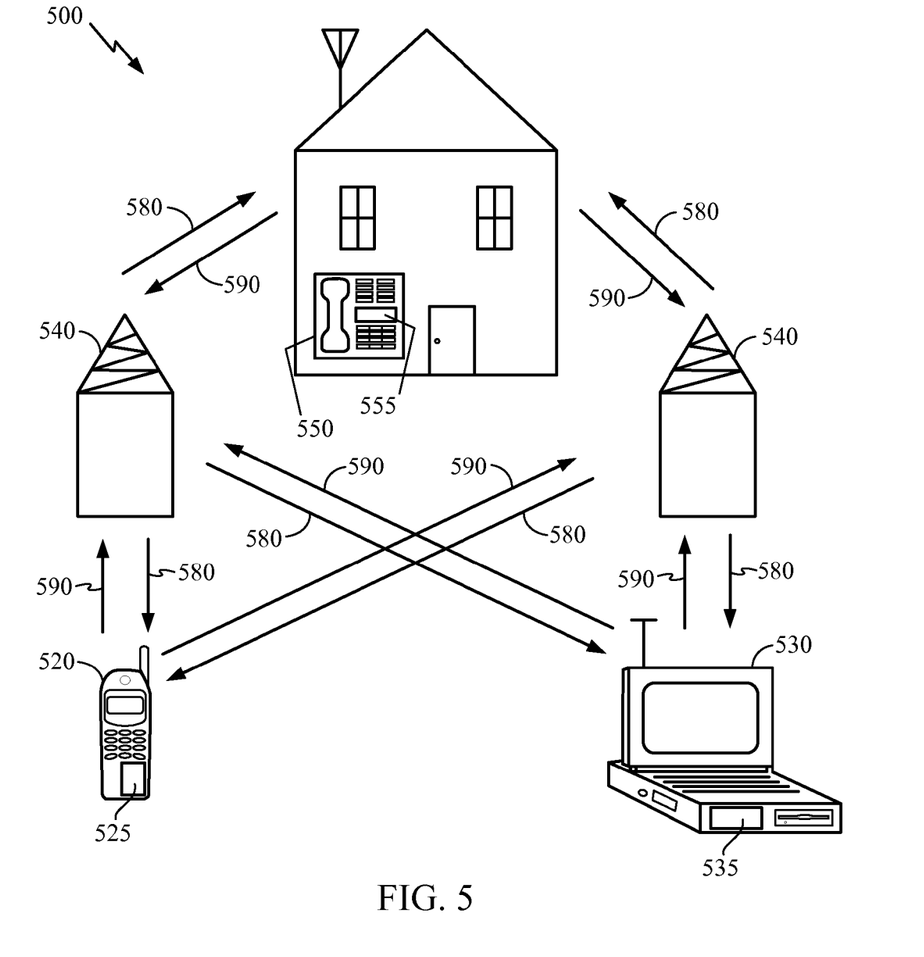
FIG. 5 shows a functional schematic of one example system of communication and computing devices having combinations of stressed fin NMOS FinFET devices in accordance with one or more exemplary embodiments.

FIG. 5 illustrates an exemplary wireless communication system 500 in which one or more embodiments of the disclosure may be advantageously employed. For purposes of illustration, FIG. 5 shows three remote units 520, 530, and 550 and two base stations 540. It will be recognized that conventional wireless communication systems may have many more remote units and base stations. The remote units 520, 530, and 550 include integrated circuit or other semiconductor devices 525, 535 and 555 (including on-chip voltage regulators, as disclosed herein), employing stressed fin NMOS FinFET devices, for example, as described in reference to FIGS. 1A-1D and 2A-2G. FIG. 5 shows forward link signals 580 from the base stations 540 and the remote units 520, 530, and 550 and reverse link signals 590 from the remote units 520, 530, and 550 to the base stations 540.

In FIG. 5, the remote unit 520 is shown as a mobile telephone, the remote unit 530 is shown as a portable computer, and the remote unit 550 is shown as a fixed location remote unit in a wireless local loop system. For example, the remote units may be any one or combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 5 illustrates remote units according to the teachings of the disclosure, the disclosure is not limited to these exemplary illustrated units. Embodiments of the disclosure may be suitably employed in any device having active integrated circuitry including memory and on-chip circuitry for test and characterization.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A stressed fin FinFET device comprising:
   a substrate;
   a fin on the substrate, comprising a semiconductor material and extending along a longitudinal axis, the longitudinal axis being parallel to the substrate, and extending, in a vertical direction, to a fin top at a fin height above the substrate; and
   an embedded fin stressor element, the embedded fin stressor element being embedded in the fin, and the embedded fin stressor element comprising silicon dioxide and being configured to urge an upward compression force within the fin, parallel to the vertical direction.

2. The stressed fin FinFET device of claim 1, wherein the semiconductor material includes silicon, and wherein the fin stressor element comprises crystallized silicon dioxide, having a crystallization that urges the upward compression force within the fin.

3. The stressed fin FinFET device of claim 2,
   wherein the fin comprises a fin base and a fin active region,
   wherein the fin active region includes a source region, a drain region, and a channel region,
   wherein the channel region is between the source region and the drain region, wherein the fin base is proximal to the substrate, and
   wherein the embedded fin stressor element is embedded in the fin base under the channel region.

4. The stressed fin FinFET device of claim 3, wherein the channel region is doped with a p+ dopant, and the source region and the drain region are doped with an n+ dopant.

5. The stressed fin FinFET device of claim 4,
   wherein the fin includes a first vertical wall and a second vertical wall,
   wherein the second vertical wall is parallel to the first vertical wall and spaced from the first vertical wall by a fin thickness,
   wherein the embedded fin stressor element has a stressor element thickness in the vertical direction, a stressor element width in a direction of the fin thickness, and a stressor element length in a direction parallel to the longitudinal axis, and wherein the stressor element width is equal to the fin thickness.

6. The stressed fin FinFET device of claim 5, wherein the embedded fin stressor element and the fin are configured to meet at an upper major interface that is interior to the fin and is spaced a depth under the fin top in a depth direction that is opposite the vertical direction, and wherein the embedded fin stressor element and the fin have a lower major interface that is spaced by the stressor element thickness under the upper major interface in the depth direction.

7. The stressed fin FinFET device of claim 6, wherein the embedded fin stressor element exerts, at the upper major interface, the upward compression force, wherein the upward compression force is against the channel region of the fin, wherein the upward compression force is in the vertical direction.

8. The stressed fin FinFET device of claim 7, wherein the embedded fin stressor element is a first embedded fin stressor element, wherein the stressed fin FinFET device further comprises a second embedded fin stressor element, the second embedded fin stressor element comprising silicon dioxide and being embedded in the fin base under the source region or under the drain region.

9. The stressed fin FinFET device of claim 8, wherein the depth is a first depth, wherein the stressor element thickness is a first stressor element thickness, wherein the upper major interface is a first upper major interface and the lower major interface is a first lower major interface, wherein the second embedded fin stressor element and the fin have a second upper major interface and a second lower major interface, wherein the second upper major interface is interior to the fin and is spaced a second depth under the fin top in the depth direction, and wherein the second lower major interface is spaced by a second stressor element thickness under the second upper major interface in the depth direction.

10. The stressed fin FinFET device of claim 9, wherein the upward compression force is a first upward compression force, wherein the second embedded fin stressor element comprises crystallized silicon dioxide, having a crystallization that exerts a second upward compression force within the fin, at the second upper major interface, the second upward compression force being against the source region of the fin, and in the vertical direction.

11. The stressed fin FinFET device of claim 10, wherein one of the first depth and the second depth is greater than the other of the first depth and the second depth.

12. The stressed fin FinFET device of claim 10, wherein one of the first stressor element thickness and the second stressor element thickness is greater than the other of the first stressor element thickness and the second stressor element thickness.

13. The stressed fin FinFET device of claim 10, wherein a sum of the first upward compression force and the second upward compression force is a total resultant upward compression force, wherein the total resultant upward compression force has a force distribution with respect to positions along the longitudinal axis.

14. The stressed fin FinFET device of claim 6, wherein the embedded fin stressor element is a first embedded fin stressor element, wherein the stressed fin FinFET device further comprises a second embedded fin stressor element and a third embedded fin stressor element, wherein the second embedded fin stressor element comprises silicon dioxide, and is embedded in the fin base under the source region, and wherein the third embedded fin stressor element comprises silicon dioxide and is embedded in the fin base under the drain region.

15. The stressed fin FinFET device of claim 14, wherein the depth is a first depth, wherein the upper major interface is a first upper major interface and the lower major interface is a first lower major interface, wherein the second embedded fin stressor element and the fin have a second upper major interface, wherein the second upper major interface is interior to the fin and is spaced a second depth under the fin top in the depth direction, wherein the third embedded fin stressor element and the fin have a third upper major interface, and wherein the third upper major interface is interior to the fin and is spaced a third depth under the fin top in the depth direction.

16. The stressed fin FinFET device of claim 15, wherein the upward compression force is a first upward compression force, wherein the second embedded fin stressor element comprises crystallized silicon dioxide, having a crystallization that exerts, at the second upper major interface, a second upward compression force against the source region of the fin, the second upward compression force being in the vertical direction, wherein the third embedded fin stressor element comprises crystallized silicon dioxide, having a crystallization that exerts, at the third upper major interface, a third upward compression force against the drain region of the fin, the third upward compression force being in the vertical direction.

17. The stressed fin FinFET device of claim 1, wherein the stressed fin FinFET device is integrated in at least one semiconductor die.

18. The stressed fin FinFET device of claim 1, further comprising a device, selected from the group consisting of a set top box, music player, video player, entertainment unit, navigation device, communication device, personal digital assistant (PDA), fixed location data unit, and a computer, into which the stressed fin FinFET device is integrated.

19. A stressed fin FinFET device comprising:

a substrate;

a fin, comprising a semiconductor material, having a fin width and extending in a vertical direction to a fin top at a fin height above the substrate, the fin having a fin base extending on the substrate along a longitudinal axis, and a fin active portion on the fin base and extending in the vertical direction to the fin top, the fin base having a height less than the fin height, the fin active portion having a source region, a drain region, and a channel region between the source region and the drain region;

a gate surrounding at least a portion of the channel region; and an embedded fin stressor element, embedded under the fin active portion, and the embedded fin stressor element comprising silicon dioxide and being configured to urge an upward compression force in the fin active portion, parallel to the vertical direction.

20. The stressed fin FinFET device of claim 19,
wherein the semiconductor material includes silicon, and
wherein the embedded fin stressor element comprises crystallized silicon dioxide, having a crystallization that urges the upward compression force.

21. The stressed fin FinFET device of claim 19,
wherein the embedded fin stressor element is a first embedded fin stressor element and is embedded in the fin base under the channel region,
wherein the upward compression force is a first upward compression force,
wherein the stressed fin FinFET device includes a second embedded fin stressor element, embedded in the fin base under one of the source region and the drain region, and comprising crystalized silicon dioxide having a crystallization that urges a second upward compression force within the fin, parallel to the vertical direction, and
wherein the stressed fin FinFET device further includes a third embedded fin stressor element, embedded in the fin base under the other of the source region and the drain region, and comprising crystallized silicon dioxide having a crystallization that urges a third upward compression force within the fin, parallel to the vertical direction.

22. The stressed fin FinFET device of claim 21, wherein the channel region is doped with a p+ dopant, and the source region and the drain region are doped with an n+ dopant.

23. The stressed fin FinFET device of claim 19, wherein the embedded fin stressor element is a first embedded fin first stressor element,
wherein the first embedded fin stressor element is embedded in the fin base under one of the source region and the drain region, and
wherein the stressed fin FinFET device further includes a second embedded fin stressor element, comprising silicon dioxide and being embedded in the fin base under the other of the source region and the drain region.

24. The stressed fin FinFET device of claim 19, wherein the stressed fin FinFET device is integrated in at least one semiconductor die.

25. The stressed fin FinFET device of claim 19, further comprising a device, selected from the group consisting of a set top box, music player, video player, entertainment unit, navigation device, communication device, personal digital assistant (PDA), fixed location data unit, and a computer, into which the stressed fin FinFET device is integrated.

* * * * *